(12) United States Patent
Choi et al.

(10) Patent No.: US 9,966,553 B2
(45) Date of Patent: May 8, 2018

(54) DISPLAY APPARATUS

(71) Applicant: Samsung Display Co., Ltd., Yongin-si, Gyeonggi-do (KR)

(72) Inventors: Manseob Choi, Yongin-si (KR); Sungkook Park, Yongin-si (KR); Minwoo Kim, Yongin-si (KR); Mingyeong Jo, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days. days.

(21) Appl. No.: 15/712,889

(22) Filed: Sep. 22, 2017

(65) Prior Publication Data

US 2018/0083218 A1 Mar. 22, 2018

(30) Foreign Application Priority Data

Sep. 22, 2016 (KR) ........................ 10-2016-0121466

(51) Int. Cl.
*H01J 1/62* (2006.01)
*H01L 51/52* (2006.01)
*H01L 27/32* (2006.01)

(52) U.S. Cl.
CPC ...... *H01L 51/5203* (2013.01); *H01L 27/3248* (2013.01); *H01L 51/5256* (2013.01); *H01L 51/5268* (2013.01); *H01L 51/5284* (2013.01)

(58) Field of Classification Search
USPC ................................................ 313/506, 498
See application file for complete search history.

(56) References Cited

U.S. PATENT DOCUMENTS 8,076,844 B2 12/2011 Oda et al.
9,076,739 B2 7/2015 Choi et al.
2014/0159067 A1 6/2014 Sakariya

FOREIGN PATENT DOCUMENTS

KR 10-2008-0065933 7/2008
KR 10-2011-0070120 A 6/2011
KR 10-2014-0142627 A 12/2014

OTHER PUBLICATIONS

Letters to Nature, Nature (Journal), Letters to Nature, Oct. 30, 1997, pp. 948-951, vol. 389, Macmillan Publishers Ltd. 1997.

*Primary Examiner* — Vip Patel
(74) *Attorney, Agent, or Firm* — Innovation Counsel LLP (57) ABSTRACT

A display apparatus includes: a substrate; a first electrode; an insulating film including an opening that extends to at least the central portion of the first electrode; a light-emitting diode disposed on the first electrode and including a first pad electrically connected to the first electrode; a reflective film disposed on the insulating film so as to cover at least a portion of an inner surface of the opening; and a light path guide layer disposed on the insulating film so as to cover at least a portion of the reflective film and including a plurality of holes or a plurality of grooves on the top surface. In one embodiment, the display apparatus improves the light extraction efficiency of the light-emitting diode.

16 Claims, 7 Drawing Sheets

DISPLAY APPARATUS

CROSS-REFERENCE TO RELATED APPLICATION

This application claims the benefit of Korean Patent Application No. 10-2016-0121466, filed on Sep. 22, 2016, in the Korean Intellectual Property Office, the disclosure of which is incorporated herein in its entirety by reference.

BACKGROUND

1. Field

One or more embodiments relate to a display apparatus, and more particularly, to a display apparatus capable of improving light extraction efficiency of a light-emitting diode.

2. Description of the Related Art

A light-emitting diode (LED) is a device for converting an electrical signal into light, such as infrared rays and visible rays, by using characteristics of compound semiconductors, and LEDs are being used in home electrical appliances, remote controllers, electric signboards, and various automation devices. LEDs are being applied to a wider range of electronic devices from small handheld electronic devices to large display apparatuses.

An LED may include a p-type semiconductor layer, an n-type semiconductor layer, and at least one quantum well layer located between the p-type semiconductor layer and the n-type semiconductor layer. Here, light emitting efficiency of a light-emitting diode system depends on internal quantum efficiency of a quantum well layer and light extraction efficiency of the system.

However, there is a limit to improving internal quantum efficiency of a light-emitting diode, and thus it is necessary to improve light extraction efficiency in a light-emitting diode system. Particularly, light beams emitted from side surfaces of a light-emitting diode are unable to propagate toward a front surface thereof, and thus overall display quality deteriorates.

SUMMARY

One or more embodiments include a display apparatus capable of improving light extraction efficiency of a light-emitting diode.

Additional aspects will be set forth in part in the description which follows and, in part, will be apparent from the description, or may be learned by practice of the presented embodiments.

According to one or more embodiments, a display apparatus includes: a substrate; a first electrode; an insulating film including an opening that extends to at least a central portion of the first electrode; a light-emitting diode disposed on the first electrode and including a first pad electrically connected to the first electrode; a reflective film disposed on the insulating film so as to cover at least a portion of an inner surface of the opening; and a light path guide layer disposed on the insulating film so as to cover at least a portion of the reflective film and including a plurality of holes or a plurality of grooves in a top surface thereof.

The display apparatus may further include a second electrode disposed on the light-emitting diode and electrically connected to a second pad of the light-emitting diode.

A cross-sectional area of a first portion of the opening toward the first electrode may be smaller than a cross-sectional area of a second portion of the opening toward the second electrode.

The opening may have a tapered portion between the first portion and the second portion.

The reflective film may be disposed so as to surround the light-emitting diode.

The reflective film may be configured to have a closed-loop-like shape.

The reflective film may include any one of aluminum, molybdenum, titanium, titanium-tungsten, nickel, chromium, silver, gold, and alloys thereof.

The reflective film may include a same material as the first electrode.

The portion of the reflective film covering the inner surface of the opening may be located on a path along which light configured to be emitted from the light-emitting diode propagates.

The reflective film and the first electrode may be integrally formed.

The light path guide layer may include an organic material.

The light path guide layer may include a light-transmissive material.

The plurality of holes or the plurality of grooves may extend from the top surface of the light path guide layer toward underlying layers below the first electrode.

The plurality of holes may penetrate completely through the light path guide layer.

The light path guide layer may include a porous material.

A refractive index of a material filling the interior of the plurality of holes or the plurality of grooves may be greater than a refractive index of a material included in the light path guide layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As embodiments allows for various changes and numerous embodiments, particular embodiments will be illustrated in the drawings and described in detail in the written description. However, this is not intended to limit embodiments to particular modes of practice, and it is to be appreciated that all changes, equivalents, and substitutes that do not depart from the spirit and technical scope of embodiments are encompassed in embodiments. In the descriptions of embodiments, certain detailed explanations of the related art are omitted when it is deemed that they may unnecessarily obscure the essence of embodiments.

It will be understood that although the terms "first", "second", etc. may be used herein to describe various components, these components should not be limited by these terms. These components are only used to distinguish one component from another.

In the following embodiments, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Hereinafter, example embodiments will be described in detail with reference to the accompanied drawings, where like reference numerals denote like or corresponding elements throughout, and redundant descriptions thereof will be omitted. Sizes of elements in the drawings may be exaggerated for convenience of explanation. In other words, since sizes and thicknesses of components in the drawings are arbitrarily illustrated for convenience of explanation, the following embodiments are not limited thereto.

Figure 1:
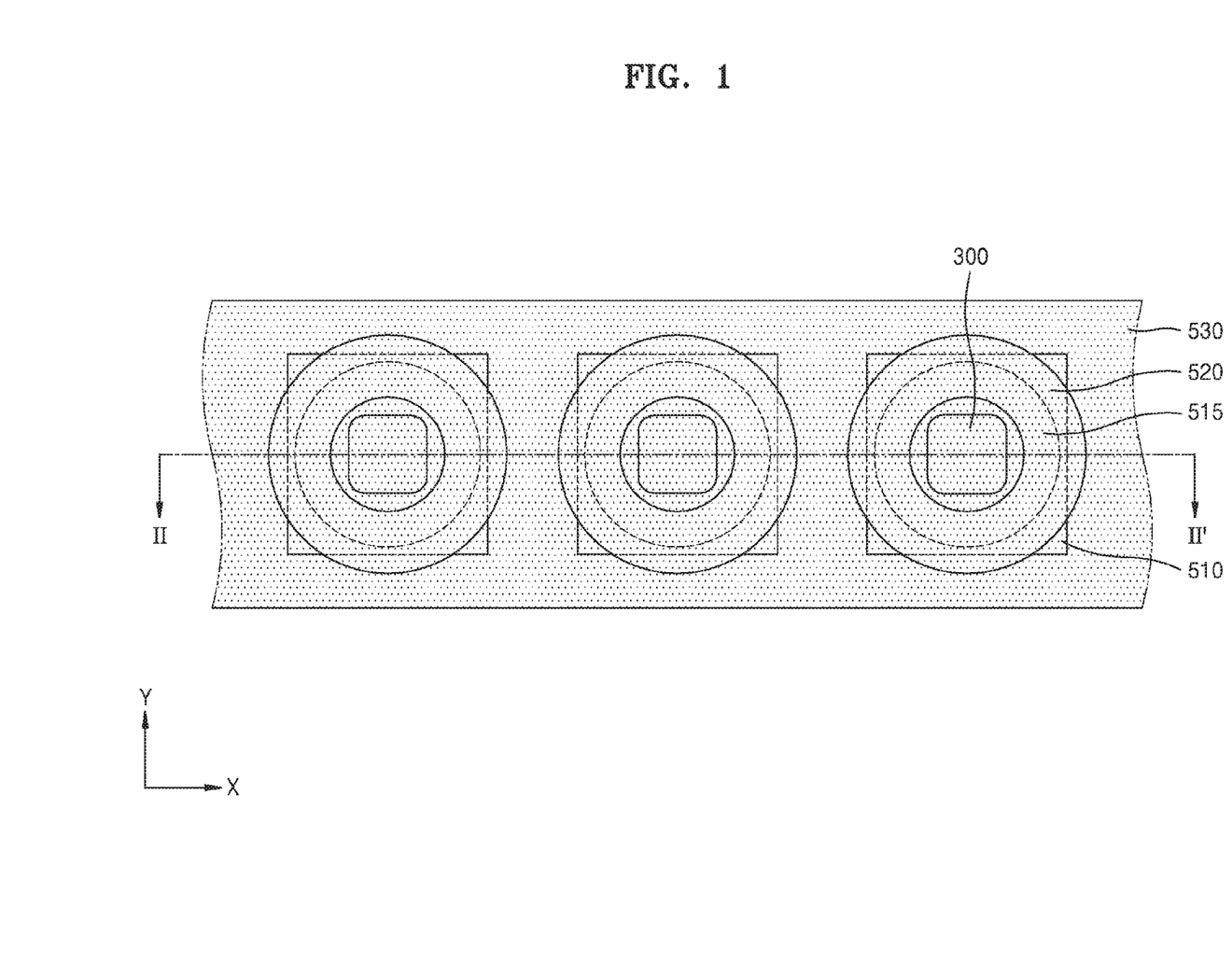
FIG. 1 is a schematic plan view of a portion of a display apparatus according to an embodiment.
Figure 2:
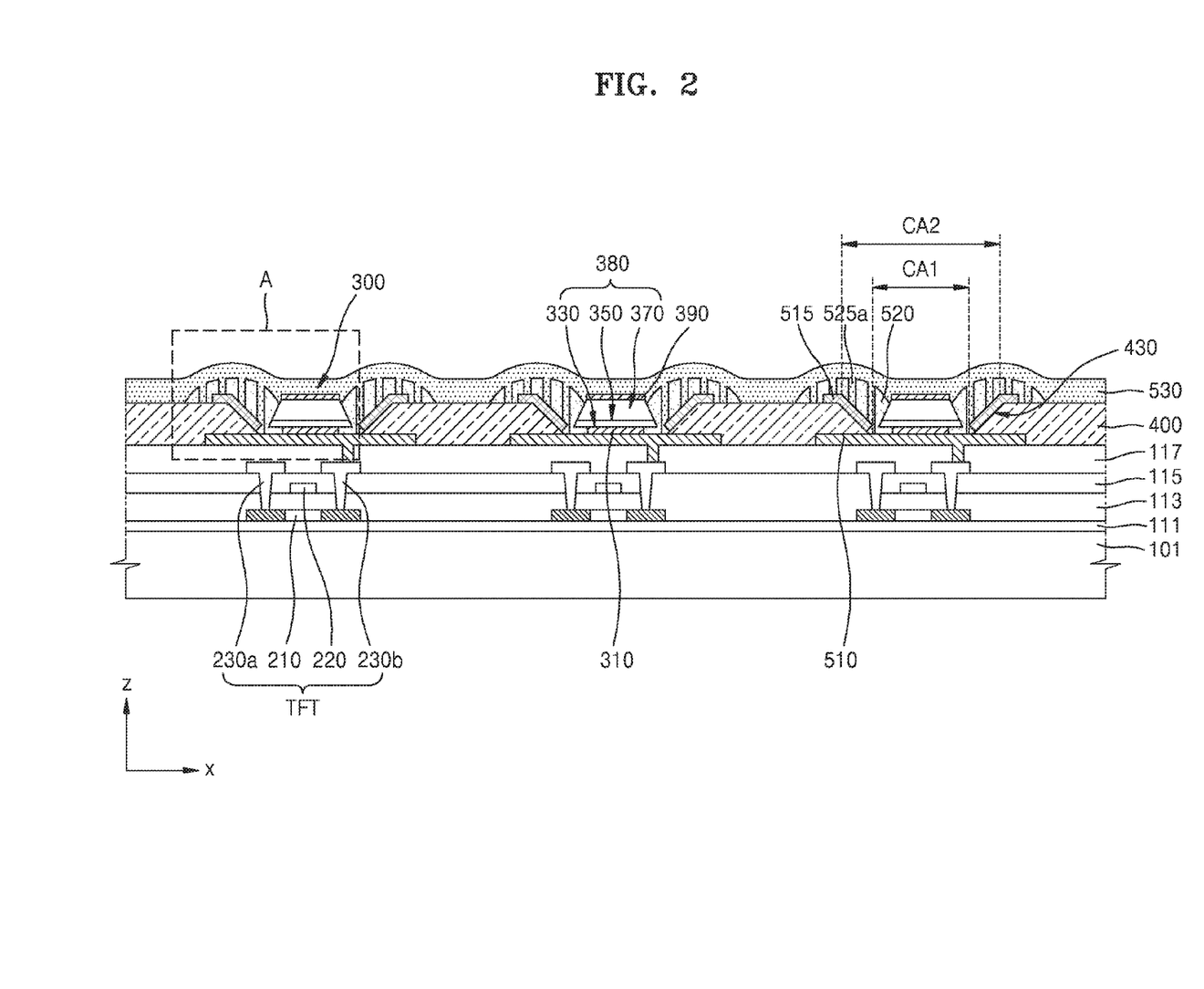
FIG. 2 is a cross-sectional view taken along a line II-II' of FIG. 1.

FIG. 1 is a schematic plan view of a portion of a display apparatus according to an embodiment, and FIG. 2 is a cross-sectional view taken along a line II-II' of FIG. 1.

Referring to FIGS. 1 and 2, a display apparatus according to an embodiment includes a first electrode 510, a second electrode 530, and a light-emitting diode 300 disposed between the first electrode 510 and the second electrode 530. Furthermore, the display apparatus according to an embodiment includes a pixel-defining film 400 exposing at least a portion of the first electrode 510, a reflective layer 515 disposed on the pixel-defining film 400, and a light path guide layer 520 disposed on the pixel-defining film 400 so as to cover at least a portion of the pixel-defining film 400.

The light-emitting diode 300 is electrically connected to a thin-film transistor array including at least one thin-film transistor TFT and at least one capacitor. The thin-film transistor array includes a scan line and a data line intersecting each other and receives a scan signal and a data signal for driving or controlling the thin-film transistor TFT through the scan line and the data line. Although only one thin-film transistor TFT electrically connected to the light-emitting diode 300 is shown in FIG. 2, embodiments are not limited thereto, and other thin-film transistors and capacitors may also be added.

A buffer layer 111 may be disposed on a substrate 101, and the thin-film transistor TFT and the light-emitting diode 300 may be disposed on the buffer layer 111.

The substrate 101 may include glass, plastic, or the like. The buffer layer 111 functions to block penetration of impurities through the substrate 101 and functions to planarize a surface of the substrate 101, and may include a single layer or a plurality of layers including an inorganic material, such as silicon nitride ($SiN_x$) and/or silicon oxide ($SiO_x$).

The thin-film transistor TFT includes an active layer 210, a gate electrode 220, a source electrode 230a, and a drain electrode 230b. The active layer 210 may include a semiconductor material and includes a source region, a drain region, and a channel region between the source region and the drain region. The gate electrode 220 is disposed on the active layer 210 so as to correspond to the channel region. The source electrode 230a and the drain electrode 230b are electrically connected to the source region and the drain region of the active layer 210, respectively. A first insulation layer 113 including an inorganic insulating material is disposed as a gate insulating film between the active layer 210 and the gate electrode 220. A second insulation layer 115 is disposed as an interlayer insulating film between the gate electrode 220 and the source electrode 230a/drain electrode 230b. A third insulation layer 117 is disposed as a planarizing film on the source electrode 230a and the drain electrode 230b. The second insulation layer 115 and the third insulation layer 117 may include an organic insulating material or an inorganic insulating material. Alternatively, the organic insulating material and the inorganic insulating material may be insulating material insulating material alternately stacked.

Although FIG. 2 shows the top gate type thin-film transistor TFT in which the gate electrode 220 is disposed above the active layer 210, embodiments are not limited thereto. For example, a gate electrode may be disposed below an active layer.

The first electrode 510 is disposed on the third insulation layer 117. The first electrode 510 is electrically connected to the source electrode 230a or the drain electrode 230b of the thin-film transistor TFT through a via hole formed in the third insulation layer 117. Although FIG. 2 shows that the first electrode 510 is electrically connected to the drain electrode 230b, embodiments are not limited thereto. For example, the first electrode 510 may be electrically connected to the source electrode 230a.

The pixel-defining film 400 defining a pixel region may be disposed on the third insulation layer 117. The pixel-defining film 400 includes an opening 430 in which the light-emitting diode 300 is to be accommodated. The opening 430 defines the pixel region by extending to and exposing at least a portion of the first electrode 510, and more specifically, at least a central portion of the first electrode 510. The height of the pixel-defining film 400 may be determined based on a height and a viewing angle of the light-emitting diode 300. A size (width) of the opening 430 may be determined based on factors including a resolution and a number of pixels of the display apparatus. Although FIG. 1 shows an example in which the opening 430 is circular, embodiments are not limited thereto. For example, the opening 430 may have a rectangular cross-section corresponding to a shape of the first electrode 510 or may have one of various other shapes including polygonal shapes, conical shapes, elliptical shapes, triangular shapes, etc. A cross-sectional area CA1 at the bottom of the opening 430 toward the first electrode 510 may be smaller than a cross-sectional area CA2 at the top of the opening 430 toward the second electrode 530. In other words, the opening 430 may have a tapered portion between the bottom and the top of the opening 430. An inner side surface of the opening 430 may be inclined with respect to the third insulation layer 117.

Although FIG. 2 shows that the pixel-defining film 400 covers edge portions of the first electrode 510, the first electrode 510 may also be disposed to cover not only the inner side surface and the bottom of the opening 430, but also the top surface of the pixel-defining film 400.

The pixel-defining film 400 functions as a light blocker with low light transmittance, and blocks light emitted from side surfaces of the light-emitting diode 300, thereby preventing colors of light emitted by adjacent light-emitting diodes 300 from mixing. Furthermore, the pixel-defining film 400 absorbs and blocks light incident from the outside, thereby improving bright room contrast of the display apparatus. The pixel-defining film 400 may include a material that absorbs at least some light, a light-reflective material, or a light-scattering material. The pixel-defining film 400 may include an insulating material that is semi-transparent or opaque with respect to visible rays (e.g., light of wavelengths in the range of 380 nm to 750 nm). The pixel-defining film 400 may include a thermoplastic resin, such as polycarbonate (PC), polyethylene terephthalate (PET), polyethersulfone, polyvinyl butyral, polyphenylene ether, polyamide, polyether imide, and norbornene system resin; a thermosetting resin, such as epoxy resin, phenolic resin, urethane resin, acrylic resin, vinyl ester resin, imide resin, urethane resin, and melamine resin; or an organic insulating material, such as polystyrene, polyacrylonitrile, or polycarbonate, but is not limited thereto. Alternatively, the pixel-defining film 400 may include an inorganic insulating material including an inorganic oxide and an inorganic nitride, such as $SiO_x$, $SiN_x$, $SiNxO_y$, $AlO_x$, $TiO_x$, $TaO_x$, and $ZnO_x$, but is not limited thereto. According to an embodiment, the pixel-defining film 400 may include an opaque material, such as a black matrix material. Examples of the black matrix material include resins and pastes, such as organic resin, glass paste, and black pigment; metal particles, such as those of nickel, aluminum, molybdenum, and alloys thereof; metal oxide particles (e.g., chromium oxide), metal nitride particles (e.g., chromium nitride), and the like.

The light-emitting diode 300 is disposed in the opening 430 of the pixel-defining film 400. The light-emitting diode 300 may be a micro LED. Here, micro may indicate a size from 1 μm to 100 μm. However, embodiments are not limited thereto, and micro may be applied to light-emitting diodes of larger or smaller sizes. The light-emitting diodes 300 may be accommodated in a plurality of openings 430 of the pixel-defining film 400 as each of the light-emitting diodes 300 or a plurality of light-emitting diodes 300 are picked up from a wafer and transferred to the substrate 101 by a transferring mechanism. According to an embodiment, the light-emitting diode 300 may be accommodated in the opening 430 of pixel-defining film 400 after the pixel-defining film 400 and the first electrode 510 are disposed. The light-emitting diode 300 may emit light of a certain wavelength within a range of wavelengths from the ultraviolet (UV) light region to the visible light region. For example, the light-emitting diode 300 may be a red LED, a green LED, a blue LED, a white LED, or a UV LED.

The light-emitting diode 300 may include a p-n diode 380, a first pad 310, and a second pad 390. The first pad 310 and/or the second pad 390 may include one or more layers and may include various conductive materials such as metals, conductive oxides, and conductive polymers. Each of the first pad 310 and the second pad 390 may selectively include a reflective layer, e.g., a silver layer. The first pad 310 is electrically connected to the first electrode 510, whereas the second pad 390 is electrically connected to the second electrode 530. Here, the first pad 310 and/or the second pad 390 may be disposed to have a conductive ball-like shape and contact the first electrode 510 and/or the second electrode 530, respectively. The p-n diode 380 may include a lower doped layer 330, one or more quantum well layers 350, and an upper doped layer 370. The lower doped layer 330 may be a p-doped layer, whereas and the upper doped layer 370 may be an n-doped layer. Alternatively, the lower doped layer 330 may be an n-doped layer, whereas the upper doped layer 370 may be a p-doped layer. The p-n diode 380 may have a straight sidewall or a sidewall tapered in a downward direction or an upward direction.

The first electrode 510 may be disposed as a reflective electrode and may include one or more layers. For example, the first electrode 510 may include a metal, such as aluminum, molybdenum, titanium, titanium, tungsten, silver, gold, or an alloy thereof. The first electrode 510 may include a transparent conductive layer including a conductive material, such as a transparent conductive oxide (TCO) (e.g., ITO, IZO, ZnO, $In_2O_3$, etc.), a carbon nanotube film, or a transparent conductive polymer, and a reflective layer. According to an embodiment, the first electrode 510 may include a triple layer including upper and lower transparent conductive layers and a reflective layer therebetween.

The second electrode 530 may include a transparent or semi-transparent electrode. For example, the second electrode 530 may include a conductive material, such as a transparent conductive oxide (TCO) (e.g., ITO, IZO, ZnO, $In_2O_3$, etc.), a carbon nanotube film, or a transparent conductive polymer. The second electrode 530 may be disposed over an entire surface of the substrate 101 as a common electrode common to a plurality of pixels.

The reflective film 515 is disposed on the pixel-defining film 400. The reflective film 515 may cover at least a portion of the inner side surface of the opening 430 of the pixel-defining film 400 and further extend onto the top surface of the pixel-defining film 400. Here, the reflective layer 515 covering the inner side surface of the opening 430 may be inclined with respect to the third insulation layer 117.

The reflective film 515 reflects light emitted from the side surfaces of the light-emitting diode 300, so that the light propagates substantially in a direction toward a front surface of the light-emitting diode 300. In other words, by concentrating lateral light beams from the light-emitting diode 300 through the reflective film 515 and in the direction toward the front surface, light extraction efficiency of the light-emitting diode 300 may be improved and unevenness of luminance in lateral directions from the light-emitting diode 300 may be resolved. To this end, a portion of the reflective film 515 covering the inner side surface of the opening 430 is located on a path along which light emitted from the side surfaces of the light-emitting diode 300 in the opening 430 propagates, wherein factors including a size, a location, a thickness, and a material of the reflective film 515 may be determined according to factors including a size and a direction of light emitted from the light-emitting diode 300. According to designs of the light-emitting diode 300 and the reflective film 515, an inclination angle of the inner side surface of the opening 430 with respect to the third insulation layer 117 may also vary.

In order to effectively reflect lateral light beams emitted from the light-emitting diode 300, the reflective film 515 is disposed so as to surround the light-emitting diode 300 in the opening 430. The reflective layer 515 may be patterned with a plurality of patterns so as to surround the light-emitting diode 300. However, in order to increase efficiency of light concentration, the reflective layer 515 may be disposed to have a closed-loop-like shape so that it surrounds the light-emitting diode 300. Therefore, the reflective film 515 may have a ring-like shape when viewed from a position above the second electrode 530, as shown in FIG. 1.

The reflective film 515 may be a dispersed Bragg reflector (DBR) having high reflectivity or a mirror reflector including a metal so as to have high light reflectivity. For example, the reflective film 515 may include any one of aluminum, molybdenum, titanium, titanium-tungsten, nickel, chrome, silver, gold, and alloys thereof. Furthermore, the reflective film 515 may include a same material as the first electrode 510, which is a reflective electrode. Therefore, in addition to the above-stated reflective materials, the reflective film 515 may further include a transparent conductive layer including a conductive material, such as a transparent conductive oxide (TCO) (e.g., ITO, IZO, ZnO, $In_2O_3$, etc.), a carbon nanotube film, or a transparent conductive polymer. According to an embodiment, the reflective film 515 may be a triple layer including upper and lower transparent conductive layers and a reflective layer therebetween. In such a configuration, the upper and lower transparent conductive layers may prevent diffusion and/or oxidation of the reflective layer, which is an intermediate layer.

As the reflective film 515 surrounds the light-emitting diode 300 and adjusts a direction of lateral light beams emitted from the light-emitting diode 300, a risk of color mixture between adjacent pixels may be reduced. Therefore, the pixel-defining film 400 does not necessarily include a semi-transparent or opaque material, and processes for adding a light absorbing material, a light reflective material, or a light scattering material to the pixel-defining film 400 may be omitted.

The light path guide layer 520 is disposed on the reflective film 515. A portion of the light path guide layer 520 may cover at least a portion of the reflective film 515, whereas the remaining portion of the light path guide layer 520 may be disposed on the top surface of the pixel-defining film 400. However, embodiments are not limited thereto, and the light path guide layer 520 may not extend onto the top surface of the pixel-defining film 400 and may cover only a portion of the reflective layer 515. As the light path guide layer 520 overlaps the reflective film 515, the light path guide layer 520 is also disposed so as to surround the light-emitting diode 300.

According to the present embodiment, the light path guide layer 520 has a plurality of holes 525a on a top surface thereof. Although FIG. 2 shows that the plurality of holes 525a are via holes extending from the top surface to a bottom surface of the light path guide layer 520, embodiments are not limited thereto, and the plurality of holes 525a may only partially penetrate through the light path guide layer 520. Here, the plurality of holes 525a may extend from the top surface of the light path guide layer 520 toward the third insulation layer 117. As a result, the plurality of holes 525a of the light path guide layer 520 may extend in a direction toward the front surface of the light-emitting diode 300.

The light path guide layer 520 may cover the light-emitting diode 300 and function as a passivation layer for insulating the first electrode 510 and the reflective film 515 from the second electrode 530. Here, the light path guide layer 520 exposes only the second pad 390 and fills the interior of the opening 430 in which the light-emitting diode 300 is accommodated. The light path guide layer 520 may include an organic insulating material. For example, the light path guide layer 520 may include acryl, polymethylmethacrylate (PMMA), benzocyclobutene (BCB), polyimide, acrylate, epoxy, or polyester, but embodiments are not limited thereto. The second electrode 530 electrically connected to the exposed second pad 390 of the light-emitting diode 300 is disposed on the light path guide layer 520. As the second electrode 530 is disposed on the light path guide layer 520, a material for disposing the second electrode 530 may penetrate into the plurality of holes 525a formed in the top surface of the light path guide layer 520. When a separate intervening layer is disposed between the light guide layer 520 and the second electrode 530, a material for disposing the intervening layer may penetrate into the plurality of holes 525a.

After a lateral light beam from the light-emitting diode 300 is reflected by the reflective film 515, the light path guide layer 520 may guide the reflected light beam in a direction toward the front surface of the light-emitting diode 300. Hereinafter, referring to FIG. 3, a process by which the light path guide layer 520 guides light emitted from the side surfaces of the light-emitting diode 300 in the direction toward the front surface will be described in more detail.

Figure 3:
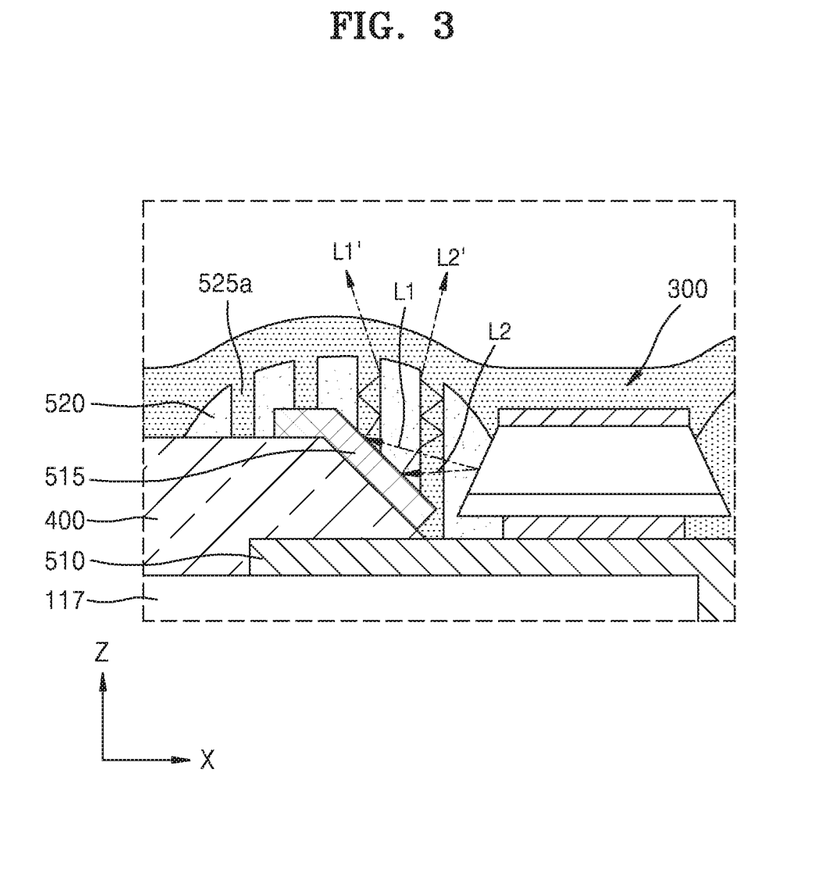
FIG. 3 is a magnified cross-sectional view of a region A of FIG. 2.

FIG. 3 is a magnified cross-sectional view of a region A of FIG. 2.

For convenience of explanation, a light beam incident to an upper portion of the reflective film 515 from among light beams emitted from the side surfaces of the light-emitting diode 300 will be referred to as a first incident light beam L1, and the first incident light beam L1 that has passed through the plurality of holes 525a and has been emitted toward the second electrode 530 will be referred to as a first emitted light beam L1'. Furthermore, a light beam incident to a lower portion of the reflective layer 515 will be referred to as a second incident light beam L2, and the second incident light beam L2 that has passed through the plurality of holes 525a and has been emitted toward the second electrode 530 will be referred to as a second emitted light beam L2'.

Referring to FIG. 3, the first incident light beam L1 is reflected by the upper portion of the reflective film 515 and enters into one of the plurality of holes 525a of the light path guide layer 520. The first incident light beam L1 is continuously reflected by the inner surface of at least one of the plurality of holes 525a and propagates in the direction in which the plurality of holes 525a penetrate through the light path guide layer 520. Therefore, the first emitted light beam L1' emitted from the plurality of holes 525a may propagate substantially in the direction toward the front surface. In other words, the direction of propagation of the first emitted light beam L1' may be closer to the direction toward the front surface than the direction of propagation of the first incident light beam L1 after the first incident light beam L1 is simply reflected by the reflective film 515.

The second incident light beam L2 is reflected by the lower portion of the reflective film 515, passes through the light path guide layer 520, and then enters into one of the plurality of holes 525a. Here, the light path guide layer 520 may include a light-transmissive material, so that the second incident light beam L2 may easily pass through the light path guide layer 520. For example, the light path guide layer 520 may include acryl, polymethylmethacrylate (PMMA), polyimide, or the like as a light-transmissive insulating material. The second incident light beam L2 is continuously reflected by the inner surface of the at least one of the plurality of holes 525a in the same manner as the first incident light beam L1, propagates in the direction toward the front surface, and becomes the second emitted light beam L2'. Therefore, the direction of propagation of the second emission light L2' may be closer to the direction toward the front surface than the direction of propagation of the second incident light beam L2 after the second incident light beam L2 is simply reflected by the reflective film 515.

Meanwhile, as described above, total reflection may be induced inside the plurality of holes 525a, such that the incident light beams L1 and L2 may be continuously reflected by the inner surfaces of the plurality of holes 525a. In other words, a material filling the interior of the plurality of holes 525a may have a refractive index greater than that of a material included in the light path guide layer 520, and an angle of incidence at which light is incident to the inner surfaces of the plurality of holes 525a may be greater than the critical angle of total reflection. Especially, in order to set the angle of incidence to be greater than the critical angle of total reflection, the material filling the interior of the plurality of holes 525a and the material included in the light path guide layer 520 may be selected so that they have a suitable difference in their respective refraction indexes. According to an embodiment, when a material included in the second electrode 530 fills the interior of the plurality of holes 525a, the material included in the light path guide layer 520 may be a material having a refractive index smaller than that of the material included in the second electrode 530.

Furthermore, in order to further improve light transmittance of the light path guide layer 520, the light path guide layer 520 may include a porous material.

Figure 4:
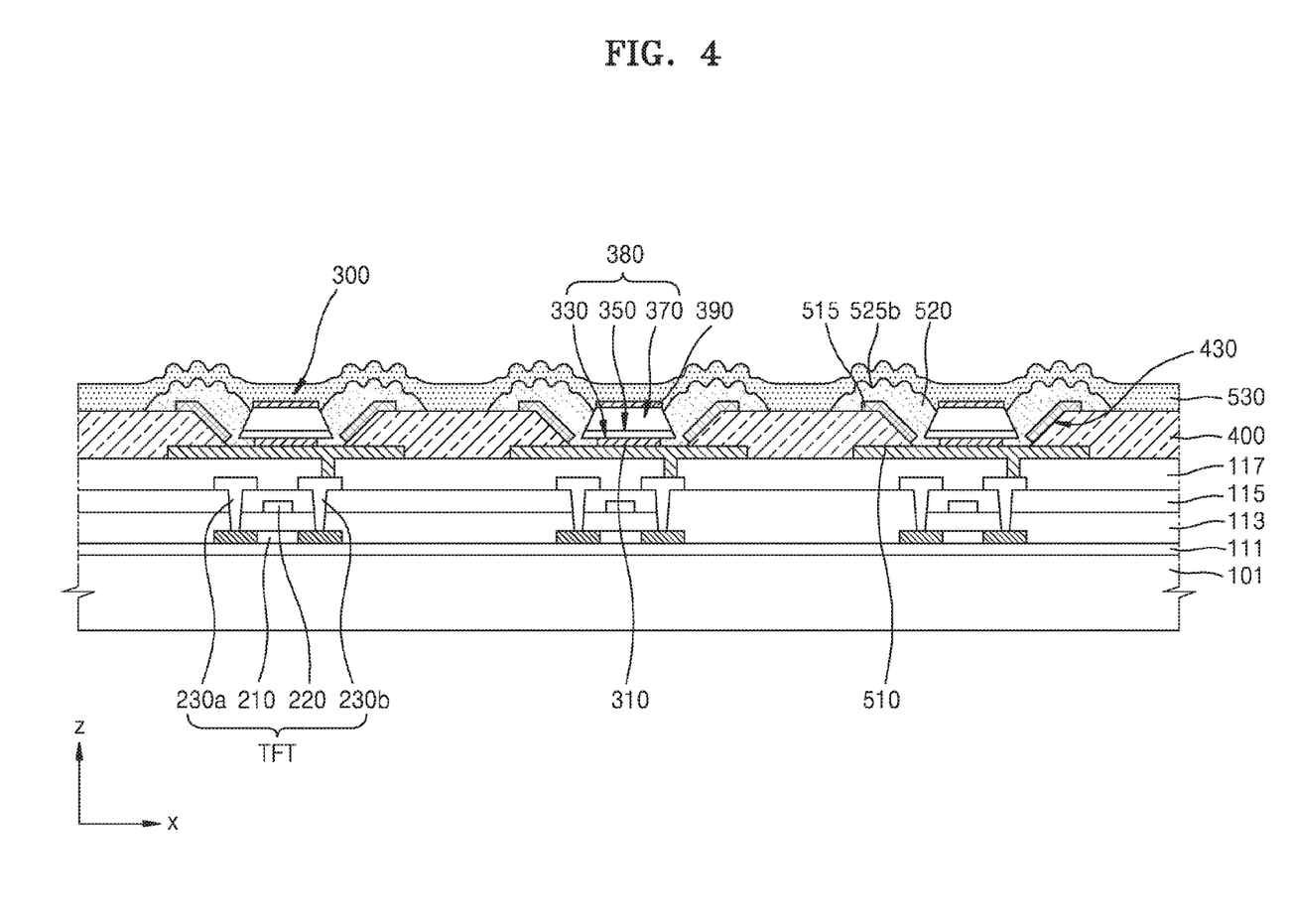
FIG. 4 is a schematic cross-sectional view of a portion of a display apparatus according to another embodiment.

FIG. 4 is a schematic cross-sectional view of a portion of a display apparatus according to another embodiment.

In the embodiment shown in FIG. 4, unlike the embodiments shown in FIGS. 2 and 3, a plurality of grooves 525b are formed in the top surface of the light path guide layer 520 instead of the plurality of holes 525a. Therefore, the present embodiment will be described in detail below, focusing on differences from the previous embodiments.

Referring to FIG. 4, the light path guide layer 520 is disposed on the reflective film 515. Unlike the previous embodiments, the light path guide layer 520 has the plurality of grooves 525b in the top surface thereof. Here, a groove 525b refers to a recessed portion. The deeper the plurality of grooves 525b are, the more similar the plurality of grooves 525b are to holes that only partially penetrate through the light path guide layer 520.

When the plurality of grooves 525b are formed in the top surface of the light path guide layer 520 as in the present embodiment, light incident from the light-emitting diode 300 is reflected by the reflective film 515 and passes through the light path guide layer 520. Next, the light that passed through the light path guide layer 520 reaches the top surface of the light path guide layer 520 and may be guided by the plurality of grooves 525b to propagate substantially in the direction toward the front surface of the light-emitting diode 300. The light may be guided by the plurality of grooves 525b due to a total reflection effect as shown in FIG. 3 or a reflection effect based on surface roughness of the top surface of the light path guide layer 520. Here, in order for light to be guided by total reflection, it is necessary for a refractive index of a material filling the interior of the plurality of grooves 525b to be greater than a refractive index of the material included in the light path guide layer 520. For example, when the second electrode 530 is disposed on the light path guide layer 520, a material included in the second electrode 530 may fill the interior of the plurality of grooves 525b.

The light path guide layer 520 may include a porous material in order to increase light transmittance thereof.

Figure 5:
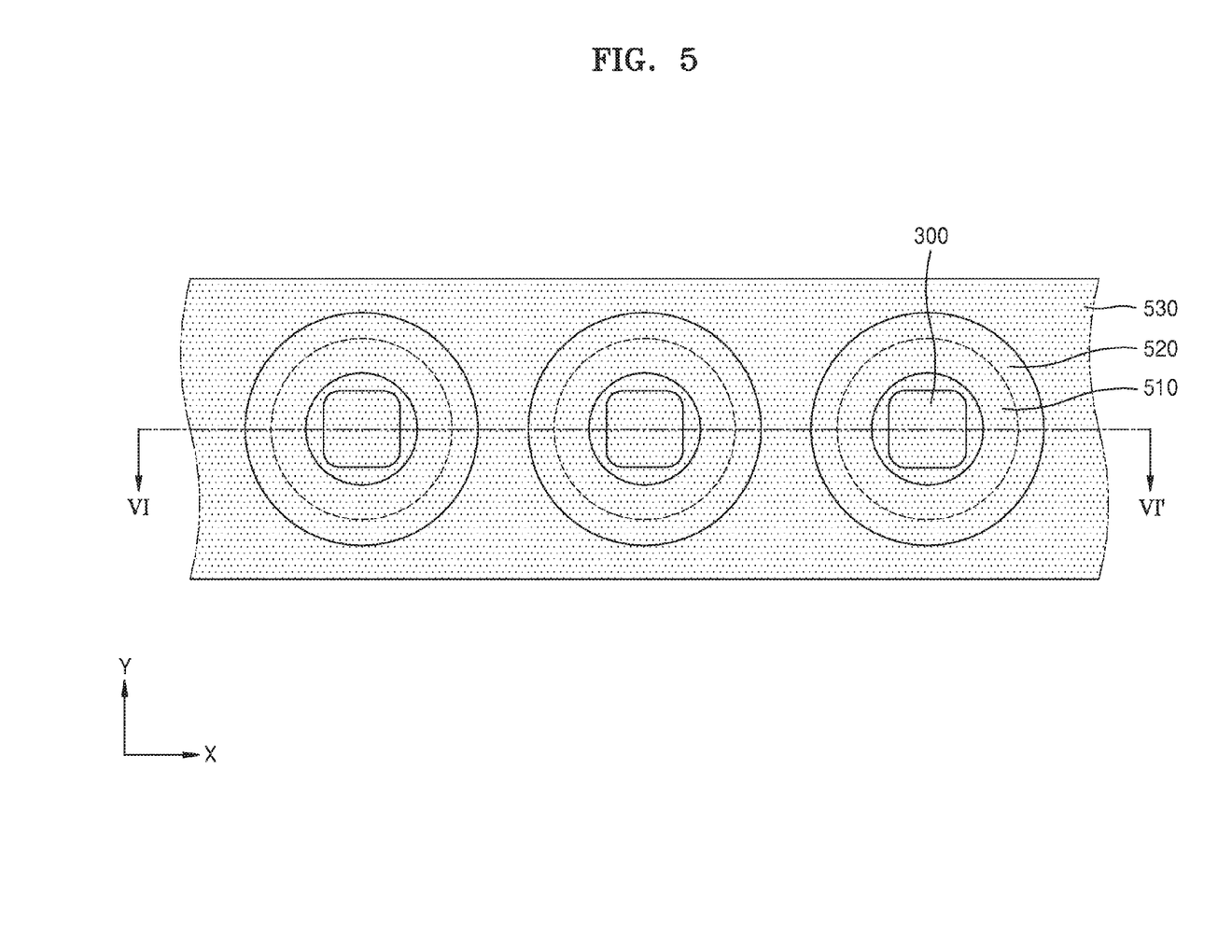
FIG. 5 is a schematic plan view of a portion of a display apparatus according to another embodiment.
Figure 6:
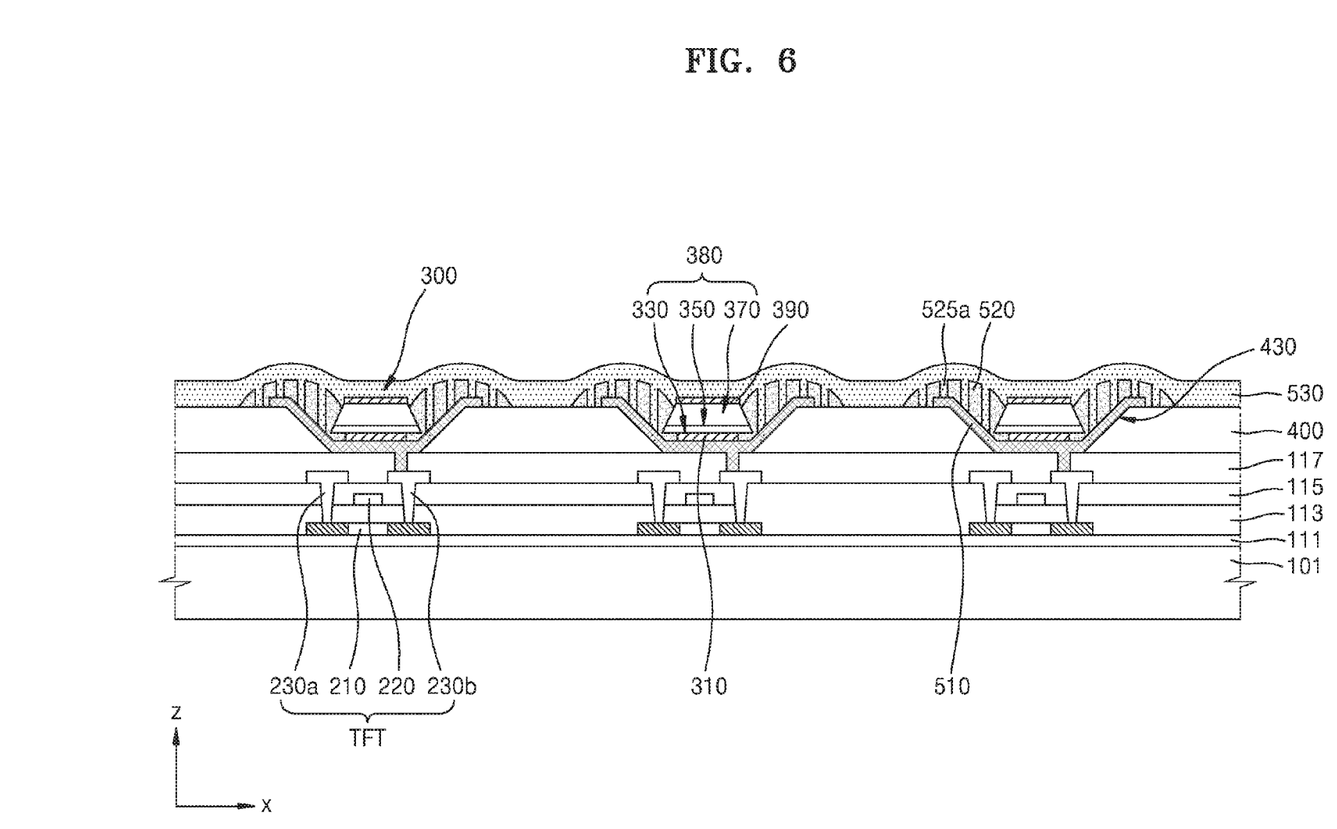
FIG. 6 is a cross-sectional view taken along a line VI-VI' of FIG. 5.

FIG. 5 is a schematic plan view of a portion of a display apparatus according to another embodiment, and FIG. 6 is a sectional view taken along a line VI-VI' of FIG. 5.

In the embodiment shown in FIGS. 5 and 6, unlike the embodiments shown in FIGS. 2 through 4, the first electrode 510 and the reflective film 515 are disposed as a single body. In particular, the embodiment shown in FIG. 6 is identical to the embodiment shown in FIG. 2 except for the structures of the first electrode and the reflective film. Therefore, the present embodiment will be described below in detail by focusing only on differences from the embodiment shown in FIG. 2.

Referring to FIGS. 5 and 6, the first electrode 510 is disposed on a thin-film transistor (TFT) array. The pixel-defining film 400 is disposed so as to expose at least the central portion of the first electrode 510. The pixel-defining film 400 has the opening 430 that extends to and exposes the first electrode 510, and the light-emitting diode 300 is accommodated in the opening 430.

The first electrode 510 is disposed so as to cover the inner surface of the opening 430 of the pixel-defining film 400. FIG. 2 shows the pixel-defining film 400 covering the edge portions of the first electrode 510. However, in the present embodiment, the first electrode 510 is disposed to cover not only the inner surface and the bottom of the opening 430, but also the top surface of the pixel-defining film 400. Since the first electrode 510 is disposed so as to cover the inner surface of the pixel-defining film 400, the first electrode 510 also functions as the reflective layer 515 shown in FIG. 2. Therefore, the first electrode 510 is disposed as a reflective electrode to reflect light emitted from the side surfaces of the light-emitting diode 300. For example, the first electrode 510 may include any one of aluminum, molybdenum, titanium, titanium-tungsten, nickel, chromium, silver, gold, and alloys thereof.

The cross-section of the opening 430 may have various shapes, such as a circular shape and a rectangular shape. However, FIG. 5 shows that the cross-section of the opening 430 has a circular shape. Therefore, as shown in FIG. 5, the first electrode 510 disposed so as to cover the inner surface of the opening 430 also has a circular shape when viewed from a position above the second electrode 530.

The first pad 310 of the light-emitting diode 300 is mounted on a central portion of the first electrode 510, and the light path guide layer 520 is disposed on the first electrode 510 while only the second pad 390 of the light-emitting diode 300 is exposed. The light path guide layer 520 may include an organic light-transmissive insulating material. The light path guide layer 520 may function as a passivation layer for insulating the first electrode 510 and the second electrode 530 from each other.

In the present embodiment, the light path guide layer 520 has the plurality of holes 525a in the top surface thereof. Light emitted from the side surfaces of the light-emitting diode 300 is reflected by a portion of the first electrode 510 covering the inner surface of the opening 430. Next, the reflected light enters the plurality of holes 525a and is continuously reflected by the inner surfaces of the plurality of holes 525a, thereby propagating in the direction in which the plurality of holes 525a penetrate through the light path guide layer 520. Therefore, lateral light beams emitted from the light-emitting diode 300 may be guided to propagate substantially in the direction toward the front surface of the light-emitting diode 300.

Figure 7:
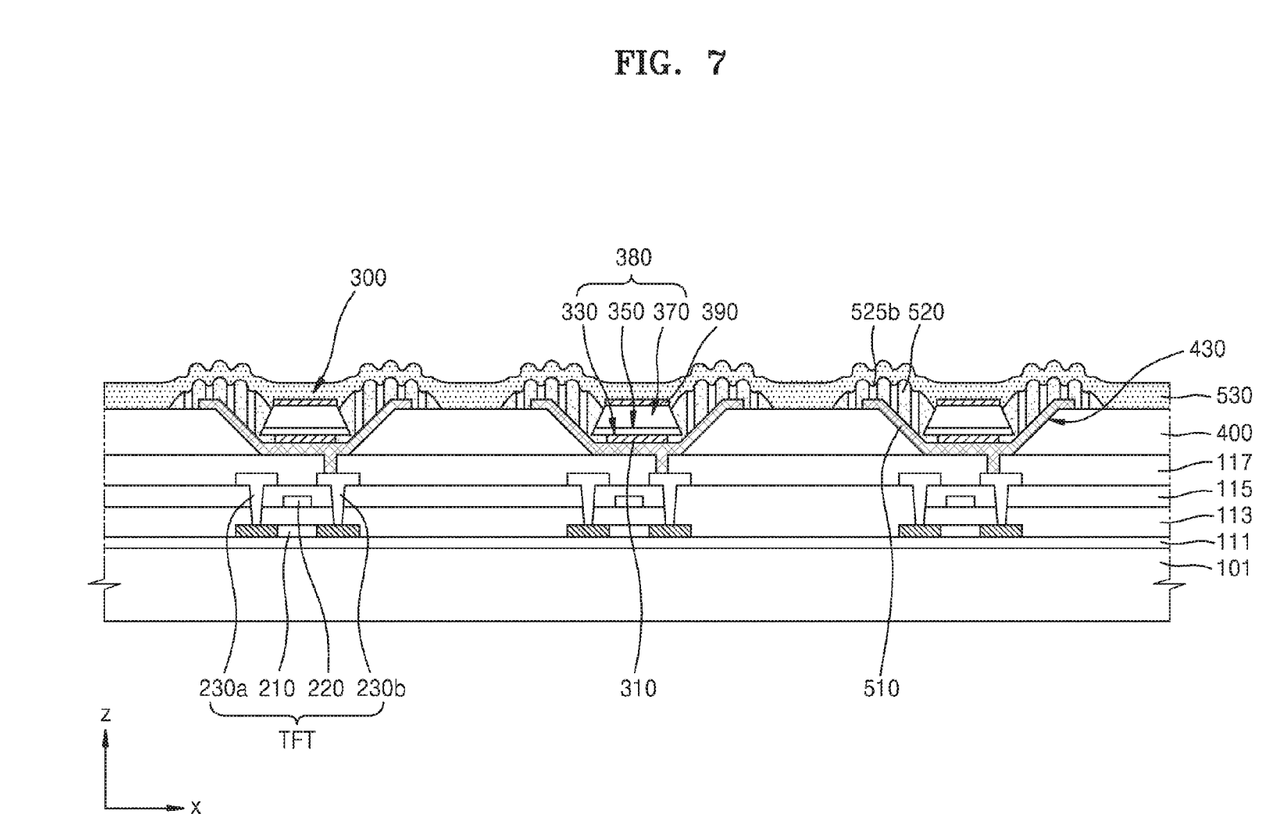
FIG. 7 is a schematic cross-sectional view of a portion of a display apparatus according to another embodiment.

FIG. 7 is a schematic cross-sectional view of a portion of a display apparatus according to another embodiment.

In the embodiment shown in FIG. 7, unlike the previous embodiments, the first electrode 510 and the reflective film 515 are formed as a single body and the plurality of grooves 525b are formed in the top surface of the light path guide layer 520 instead of the plurality of holes 525a. Therefore, except that the plurality of grooves 525b are formed in the top surface of the light path guide layer 520, the present embodiment is identical to the embodiment shown in FIG.

6. Thus, the present embodiment will be described below in detail by only focusing on differences from the embodiment shown in FIG. 6.

Referring to FIG. 7, the first electrode 510 is disposed so as to cover the inner surface of the opening 430 of the pixel-defining film 400. Specifically, the first electrode 510 is disposed so as to cover not only the inner surface and the bottom of the opening 430, but also the top surface of the pixel-defining film 400. Since the first electrode 510 is disposed so as to cover the inner surface of the opening 430 of the pixel-defining film 400, the first electrode 510 also functions as the reflective layer 515 shown in FIGS. 1 through 4. Therefore, the first electrode 510 is disposed as a reflective electrode to reflect light emitted from the side surfaces of the light-emitting diode 300.

The light path guide layer 520 is disposed on the first electrode 510 while only the second pad 390 of the light-emitting diode 300 is exposed. Unlike the embodiment shown in FIG. 6, the plurality of grooves 525b are formed in the top surface of the light path guide layer 520. When the plurality of grooves 525b are formed in the top surface of the light path guide layer 520 as in the present embodiment, light incident from the light-emitting diode 300 is reflected by the first electrode 510 and passes through the light path guide layer 520. Next, the light that passed through the light path guide layer 520 reaches the top surface of the light path guide layer 520 and may be guided by the plurality of grooves 525b to propagate substantially in the direction of the front surface of the light-emitting diode 300. Here, so that a sufficient guiding effect of the light path guide layer 520 is obtained, a refractive index of a material filling the interior of the plurality of grooves 525b may be greater than a refractive index of a material included in the light path guide layer 520, thereby inducing the inner surfaces of the plurality of grooves 525b to provide total reflection.

According to an embodiment as described above, light extraction efficiency of a light-emitting diode may be improved.

Furthermore, by improving light extraction efficiency of a light-emitting diode, power consumption of a display apparatus may be reduced.

Furthermore, deterioration in lateral luminance of a display apparatus may be prevented.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
    a substrate;
    a first electrode;
    an insulating film comprising an opening that extend to at least a central portion of the first electrode;
    a light-emitting diode disposed on the first electrode and comprising a first pad electrically connected to the first electrode;
    a reflective film disposed on the insulating film so as to cover at least a portion of an inner surface of the opening; and
    a light path guide layer disposed on the insulating film so as to cover at least a portion of the reflective film and comprising a plurality of holes or a plurality of grooves in a top surface thereof.

2. The display apparatus of claim 1, further comprising a second electrode disposed on the light-emitting diode and electrically connected to a second pad of the light-emitting diode.

3. The display apparatus of claim 1, wherein a cross-sectional area of a first portion of the opening toward the first electrode is smaller than a cross-sectional area of a second portion of the opening toward the second electrode.

4. The display apparatus of claim 3, wherein the opening has a tapered portion between the first portion and the second portion.

5. The display apparatus of claim 1, wherein the reflective film is disposed so as to surround the light-emitting diode.

6. The display apparatus of claim 5, wherein the reflective film is configured to have a closed-loop-like shape.

7. The display apparatus of claim 1, wherein the reflective film comprises any one of aluminum, molybdenum, titanium, titanium-tungsten, nickel, chromium, silver, gold, and alloys thereof.

8. The display apparatus of claim 1, wherein the reflective film comprises a same material as the first electrode.

9. The display apparatus of claim 1, wherein the portion of the reflective film covering the inner surface of the opening is located on a path along which light configured to be emitted from the light-emitting diode propagates.

10. The display apparatus of claim 1, wherein the reflective film and the first electrode are integrally formed.

11. The display apparatus of claim 1, wherein the light path guide layer comprises an organic material.

12. The display apparatus of claim 1, wherein the light path guide layer comprises a light-transmissive material.

13. The display apparatus of claim 1, wherein the plurality of holes or the plurality of grooves extend from the top surface of the light path guide layer toward underlying layers below the first electrode.

14. The display apparatus of claim 13, wherein the plurality of holes penetrate completely through the light path guide layer.

15. The display apparatus of claim 1, wherein the light path guide layer comprises a porous material.

16. The display apparatus of claim 1, wherein a refractive index of a material filling the interior of the plurality of holes or the plurality of grooves is greater than a refractive index of a material included in the light path guide layer.

* * * * *